(12) United States Patent
Brodsky et al.

(10) Patent No.: US 8,179,693 B2
(45) Date of Patent: May 15, 2012

(54) APPARATUS FOR ELECTRICALLY CONNECTING TWO SUBSTRATES USING A LAND GRID ARRAY CONNECTOR PROVIDED WITH A FRAME STRUCTURE HAVING POWER DISTRIBUTION ELEMENTS

(75) Inventors: William Louis Brodsky, Binghamton, NY (US); Mark Kenneth Hoffmeyer, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 1289 days.

(21) Appl. No.: 11/693,824

(22) Filed: Mar. 30, 2007

(65) Prior Publication Data
US 2008/0239683 A1    Oct. 2, 2008

(51) Int. Cl.
  *H05K 1/11*    (2006.01)
  *H05K 1/14*    (2006.01)
(52) U.S. Cl. ......... 361/803; 361/770; 361/772; 361/774
(58) Field of Classification Search .......... 361/770–774, 361/803; 439/66
See application file for complete search history.

(56) References Cited

U.S. PATENT DOCUMENTS

| 5,049,084 | A * | 9/1991 | Bakke ........................ 439/66 |
| 5,237,743 | A * | 8/1993 | Busacco et al. ............... 29/885 |
| 6,229,209 | B1 | 5/2001 | Nakamura et al. |
| 6,386,890 | B1 | 5/2002 | Bhatt et al. |
| 6,791,846 | B2 * | 9/2004 | Smith et al. .................. 361/803 |
| 7,079,398 | B2 | 7/2006 | Hoffmeyer |
| 7,173,193 | B2 * | 2/2007 | Brodsky et al. ............... 174/255 |

OTHER PUBLICATIONS

"One Piece Compression Interfaces", Samtec, Inc., http://www.samtec.com/sudden_service/current_literature/Z_Beam/Iga.html.
Hassaun Jones-Bey, "Circuitry Leaps from 2-D Boards to 3-D Forms", Laser Focus World, Jan. 2004.
"Bi-Metallic Contact for Force Modulation with Temperature for CPU Packages and Land Grid Array Sockets", IP.com No. IPCOM000135682D, IP.com, Apr. 21, 2006.

* cited by examiner

*Primary Examiner* — Tuan T Dinh
(74) *Attorney, Agent, or Firm* — Matthew J. Bussan

(57) ABSTRACT

Apparatus for electrically connecting two substrates using a land grid array (LGA) connector provided with a frame structure having power distribution elements. In an embodiment, the frame structure includes a frame having one or more conductive layers sandwiched between non-conductive layers. The frame may, for example, be a printed wire board (PWB) having power planes that distribute power from a first substrate (e.g., a system PWB) and/or a power cable to a second substrate (e.g., an electronic module). The frame includes one or more apertures configured to receive an LGA interposer for electrically connecting the two substrates. Preferably, the frame includes four apertures arranged in quadrants that each receive an interposer, and at least one power plane extends between two quadrants and/or adjacent to a peripheral edge of one or more quadrants in the form of stacked and/or parallel bus bars each defining a power domain.

17 Claims, 11 Drawing Sheets

APPARATUS FOR ELECTRICALLY CONNECTING TWO SUBSTRATES USING A LAND GRID ARRAY CONNECTOR PROVIDED WITH A FRAME STRUCTURE HAVING POWER DISTRIBUTION ELEMENTS

BACKGROUND OF THE INVENTION

1. Field of Invention

The present invention relates in general to the electrical connector field. More particularly, the present invention relates to land grid array (LGA) connectors incorporating a frame structure having one or more power distribution elements (e.g., bus bars).

2. Background Art

Electrical connectors are in widespread use in the electronics industry. In many computer and other electronic circuit structures, an electronic module such as a central processor unit (CPU), memory module, application-specific integrated circuit (ASIC) or other integrated circuit, must be connected to a printed wiring board (PWB). Printed wiring boards are also known as printed circuit boards (PCBs) and etched wiring boards. When populated with one or more electronic components, a printed wiring board is often referred to as a printed wiring board assembly (PWBA) or a printed circuit board assembly (PCBA). In connecting an electronic module to a PWB, a plurality of individual electrical contacts on the base of the electronic module must be connected to a plurality of corresponding individual electrical contacts on the PWB. This set of contacts on the PWB dedicated to contacting the electronic module contacts is known as a land grid array (LGA) site when a LGA connector is used to connect the electronic module to the PWB.

Rather than permanently soldering the electronic module contacts to the LGA site, it is desirable to use LGA connectors that allow the electronic module to be installed to and removed from the LGA site. LGA connectors provide the user with the flexibility to upgrade or replace electronic modules during the manufacturing cycle and in the field. LGA connectors are also known as sockets, interconnects, interposers, carriers, and button board assemblies. Generally, LGA connectors include "true" LGA connectors where both the PWB and the electronic module are mated with contacts through mechanical/pressure contact, as well as "hybrid" LGA connectors where the contacts are soldered to the PWB and make mechanical/pressure contact with the electronic module.

In general, LGA connectors provide electrical connections between two parallel electrical substrates in computing equipment through the use of an interposer. Typically, one of these substrates is a PWB and the other is an electronic module, which may, for example, have either a ceramic or organic laminate substrate. However, supplying power or current into the LGA connectors can create design difficulties and usage limitations.

PWBs typically include multiple conductive layers laminated with insulating plastic therebetween. The conductive layers are typically reserved for power, power return, ground, and signals. The layers reserved for signals are typically etched to form "traces" that conduct the signals. The layers reserved for power, power return and ground are typically referred to as "power planes", "power return planes", and "ground planes". The reason these layers are referred to as planes is because they typically extend in a planar region to distribute power over at least a portion of the PWB. Various of the conductive layers may be connected together through drilling holes called vias and then plating each via with a conductor to form a plated-through-hole (PTH). Typically, the planes are interrupted by clearance holes to avoid shorting to the plated-through-holes. These clearance holes, as discussed in more detail below, can make power distribution difficult in certain portions of the PWB, including the LGA site, because in those portions the planes may resemble something akin to "swiss cheese" due to a high concentration of clearance holes.

Since typical electronic modules use multiple voltages for various chips and functions, the planes in the PWB that are reserved for power are typically divided into multiple domains. As the LGA contacts are assigned to various functions, the PTH of the PWB associated with a particular LGA contact has to be isolated from other planes by clearance holes in the plane or anti-pad to prevent electrical shorts. These clearance holes may, for example, account for greater than approximately ⅔ of the PTHs on a given power plane. Typically, each clearance hole is about ¾ of the width of the LGA contact pitch. Thus, over ½ of the power plane can be missing in any row or column of LGA contacts, which increases the power plane electrical resistance and power dissipation due to current flow.

A trend in the electronics industry has been to increase both the quantity of LGA sites and the density of each LGA site, i.e., the number of contacts per unit area at the LGA site. This trend exacerbates the power distribution problem that is associated with LGA connectors.

It should therefore be apparent that a need exists for an enhanced mechanism for power distribution in LGA connectors used to connect two substrates.

SUMMARY OF THE INVENTION

According to the preferred embodiments of the present invention, two substrates are electrically connected using a land grid array (LGA) connector provided with a frame structure having power distribution elements. In one embodiment, the frame structure includes a frame having one or more conductive layers sandwiched between non-conductive layers. The frame may, for example, be a printed wire board (PWB) having power planes that distribute power from a first substrate (e.g., a system PWB) and/or a power cable to a second substrate (e.g., an electronic module). The frame includes one or more apertures configured to receive an LGA interposer for electrically connecting the two substrates. Preferably, the frame includes four apertures arranged in quadrants that each receive an interposer, and at least one power plane extends between two quadrants and/or adjacent to a peripheral edge of one or more quadrants in the form of stacked and/or parallel bus bars each defining a power domain. In another embodiment, the frame structure includes a frame portion and at least one interposer portion that are contiguous and have an integral, one-piece construction.

The foregoing and other features and advantages of the present invention will be apparent from the following more particular description of the preferred embodiments of the present invention, as illustrated in the accompanying drawings.

BRIEF DESCRIPTION OF THE DRAWINGS

The preferred exemplary embodiments of the present invention will hereinafter be described in conjunction with the appended drawings, where like designations denote like elements.

DETAILED DESCRIPTION OF THE PREFERRED EMBODIMENTS 1.0 Overview

In accordance with the preferred embodiments of the present invention, two substrates are electrically connected using a land grid array (LGA) connector provided with a frame structure having power distribution elements. In one embodiment, the frame structure includes a frame having one or more conductive layers sandwiched between non-conductive layers. The frame may, for example, be a printed wire board (PWB) having power planes that distribute power from a first substrate (e.g., a system PWB) and/or a power cable to a second substrate (e.g., an electronic module). The frame includes one or more apertures configured to receive an LGA interposer for electrically connecting the two substrates. Preferably, the frame includes four apertures arranged in quadrants that each receive an interposer, and at least one power plane extends between two quadrants and/or adjacent to a peripheral edge of one or more quadrants in the form of stacked and/or parallel bus bars each defining a power domain. In another embodiment, the frame structure includes a frame portion and at least one interposer portion that are contiguous and have an integral, one-piece construction.

The provision of power distribution elements in the frame structure in accordance with the preferred embodiments of the invention permits power distribution to be enhanced and the voltage drop on the power planes to be reduced, which advantageously reduces power dissipation and temperature rise of the electronic module (module T-rise).

In addition, the provision of an external power input, such as a power cable, to the frame structure in combination with the provision of power distribution elements in the frame structure in accordance with the preferred embodiments of the invention advantageously permits a reduction in power planes in the system PWB.

2.0 Detailed Description

Figure 1:
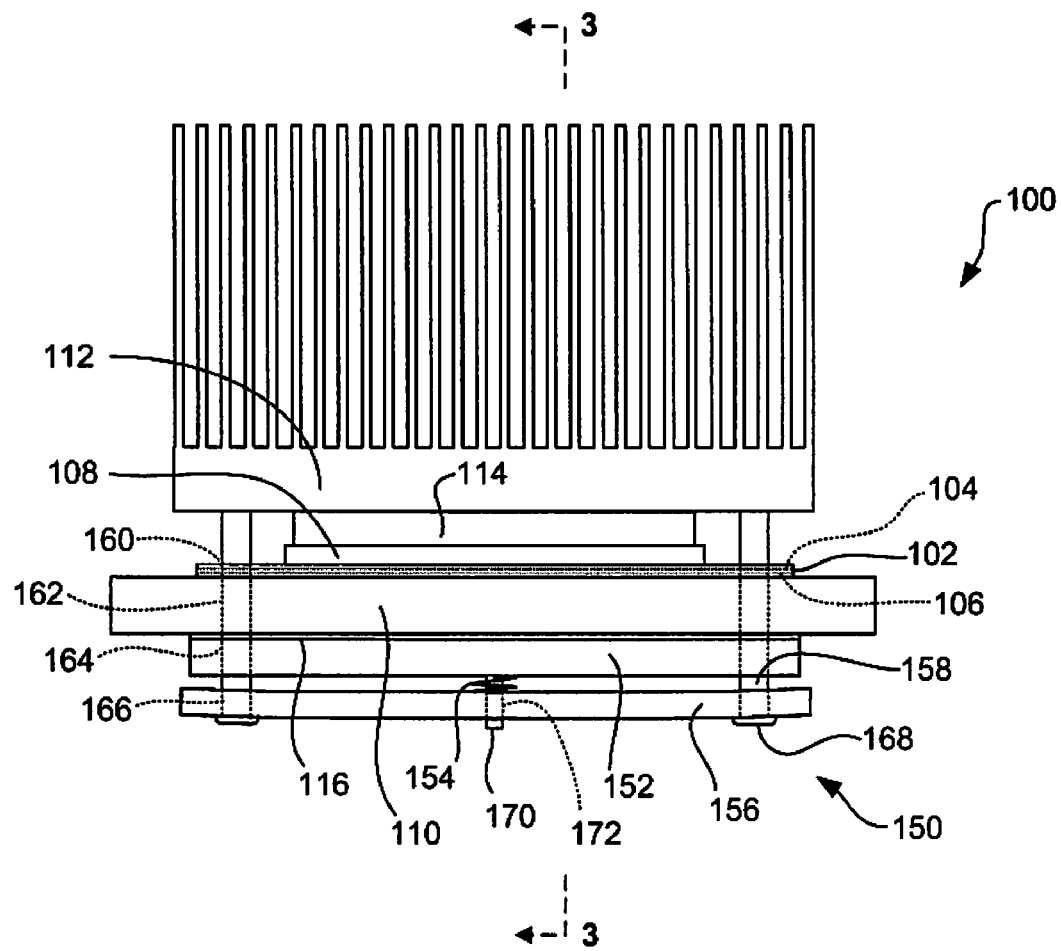
FIG. 1 is a side perspective view of a printed wiring board assembly having a land grid array (LGA) connector provided with a frame that incorporates power distribution elements according to the preferred embodiments of the present invention.

With reference to the figures and in particular FIG. 1, there is depicted, in a side perspective view, a printed wiring board assembly (PWBA) 100 having a frame 102 that incorporates one or more power distributions elements, such as bus bars 104 and 106, in accordance with the preferred embodiments of the present invention. Preferably, the frame 102 is provided with one or more interposers (not shown in FIG. 1) received in apertures that extend through the frame 102. Alternatively, or in addition, the one or more of the land grid array (LGA) interposers and the frame 102 may be contiguous and joined integrally together as a one-piece unit. The frame 102 and the one or more LGA interposers are sandwiched between a module substrate 108 and a printed wiring board (PWB) 110. Although the preferred embodiments of the present invention are described herein within the context of a LGA connector that connects an electronic module to a PWB, one skilled in the art will appreciate that many variations are possible within the scope of the present invention. For example, the present invention may be utilized in connecting any two substrates, such as connecting a ribbon substrate to any of a PWB, an electronic module, or another ribbon substrate.

A rectilinear heat sink 112 is connected to a bare die or module cap 114, which is in turn connected to module substrate 108. Heat sink 112 provides heat transfer functions, as is well known in the art. Electronic components, such a microprocessors and integrated circuits, must operate within certain specified temperature ranges to perform efficiently. Excessive heat degrades electronic component performance, reliability, life expectancy, and can even cause failure. Heat sinks, such as rectilinear heat sink 112, are widely used for controlling excessive heat. Typically, heat sinks are formed with fins, pins or other similar structures to increase the surface area of the heat sink and thereby enhance heat dissipation as air passes over the heat sink. In addition, it is not uncommon for heat sinks to contain high performance structures, such as vapor chambers and/or heat pipes, to further enhance heat transfer. Heat sinks are typically formed of metals, such as copper or aluminum. The use of a heat sink, per se, is not necessary for purposes of the present invention, but is important in understanding an environment in which the present invention may be used.

Electronic components are generally packaged using electronic packages (i.e., modules) that include a module substrate, such as a ceramic or organic laminate module substrate, to which the electronic component is electronically connected. In some cases, the module includes a cap (i.e., capped modules) which seals the electronic component within the module. In other cases, the module does not include a cap (i.e., a bare die module). In the case of a capped module, a heat sink is typically attached with a thermal interface between a bottom surface of the heat sink and a top surface of the cap, and another thermal interface between a bottom surface of the cap and a top surface of the electronic component. In the case of a bare die module, a heat sink is typically attached with a thermal interface between a bottom surface of the heat sink and a top surface of the electronic component.

Referring again to FIG. 1, a rigid insulator 116 is disposed along the bottom surface of PWB 110 and is preferably fabricated from fiberglass reinforced epoxy resin. Rigid insulator 116 is urged upwards against PWB 110, and PWB 110 is thereby urged upward towards the frame 102 (as well as the one or more interposers received therein) and module substrate 108, by a clamping mechanism. Preferably, the clamping mechanism is a post/spring-plate type clamping mechanism 150 as shown in FIG. 1. Because such clamping mechanisms are conventional, the post/spring-plate type clamping mechanism 150 is only briefly described below. Additional details about post/spring-plate type clamping mechanisms may be found in U.S. Pat. No. 6,386,890 to Bhatt et al., the disclosure of which is incorporated by reference herein. One skilled in the art will appreciate that any of the many different types and configurations of clamping mechanisms known in the art may be used in lieu of the post/spring-plate type clamping mechanism 150 shown in FIG. 1.

In the embodiment shown in FIG. 1, clamping mechanism 150 includes a stiffener 152, which is preferably a metal or steel plate. An upward force is generated by a spring 154, which directs force upward against stiffener 152 through interaction with a spring-plate 156. It is preferred that spring-plate 156 is a square structure with about the same overall footprint depth as heat sink 112. Four cylindrical posts 158 are connected at the four corners of rectilinear heat sink 112 and disposed through cylindrical frame post holes 160, PWB post holes 162, post holes in insulator 116, stiffener post holes 164, and spring-plate post holes 166. Post mushroom heads 168 are formed at the ends of posts 158. The post mushroom heads 168 rest against spring-plate 156 and thereby prevent spring-plate 156 from moving downward. Downward expansion or deflection forces from spring 154 are exerted directly upon spring-plate 156, which translates the forces through posts 158, heat sink 112, bare die or module cap 114 into module substrate 108, thereby forcing module substrate 108 downward until module substrate 108 comes into contact with and exerts force upon an upper surface of the frame 102 and the one or more interposers. For example, the upper surface of the frame 102 and the one or more interposers may include stops (not shown in FIG. 1) upon which the module substrate 108 comes into contact. Similarly, force from spring 154 is also exerted upwards by spring 154 and translated through stiffener 152 and insulator 116 into PWB 110, forcing PWB 110 upwards until PWB 110 comes into contact with and exerts force upon a lower surface of the frame 102 and the one or more interposers. For example, the lower surface of the frame 102 and the one or more interposers may include stops (not shown in FIG. 1) upon which the PWB 110 comes into contact. Accordingly, PWB 110 and module substrate 108 are forced toward each other with compressive forces upon the frame 102 and the one or more interposers disposed therebetween.

Spring-plate 156 also has a threaded screw 170 in the center of spring 154. When screw 170 is turned clockwise, its threads travel along corresponding thread grooves in a spring-plate screw hole 172 in spring-plate 156 and, accordingly, screw 170 moves upward toward and against stiffener 152. As screw 170 engages stiffener 152 and exerts force upward against it, corresponding relational force is exerted by the threads of screw 170 downward against the thread grooves in spring-plate 156. As illustrated above in the discussion of spring 154, the downward force exerted by screw 170 is translated by spring-plate 156, post mushroom heads 168, posts 158, heat sink 112 and the bare die or module cap 114 into module substrate 108, thereby forcing module substrate 108 downward until module substrate 108 comes into contact with and exerts force against the upper surface (e.g., stops) of the frame 102 and the one or more interposers. Similarly, upward force from screw 170 is translated through stiffener 152 and insulator 116 into PWB 110, forcing PWB 110 upwards until PWB 110 comes into contact with and exerts force against the lower surface (e.g., stops) of the frame 102 and the one or more interposers. Accordingly, after screw 170 is rotated clockwise into contact with stiffener 152, additional clockwise rotation of screw 170 results in increasing compressive force exerted by PWB 110 and module substrate 108 upon the frame 102 and the one or more interposers disposed therebetween.

Figure 2:
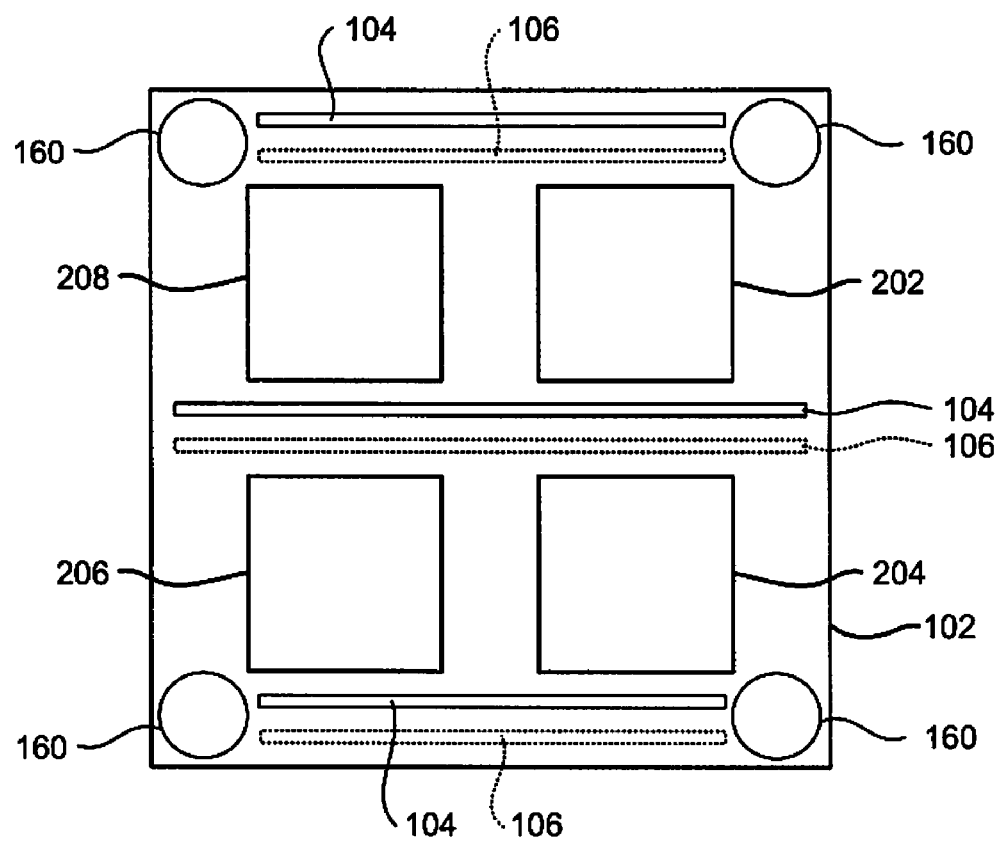
FIG. 2 is top perspective view of the frame shown in FIG. 1. The frame is shown with an upper portion cut away to reveal underlying bus bars.

FIG. 2 illustrates, in a top perspective view, the frame 102 shown in FIG. 1. The frame 102 is shown with an upper portion (e.g., a layer of non-conductive material) cut away to reveal underlying bus bars 104, 106. In accordance with the preferred embodiments of the invention, the frame 102 is a PWB having one or more layers of conductive material sandwiched between layers of non-conductive material. Hence, the frame 102 is preferably made utilizing conventional PWB laminate technology. For example, the conductive layers may be etched to define the bus bars 104, 106. Although the frame 102 is shown in the drawings as a PWB, one skilled in the art will appreciate that the frame 102 is not limited to PWBs.

The bus bars 104, 106 provide the frame 102 with power planes similar to a typical circuit board except the power planes provided by the bus bars 104, 106 typically would be thicker (e.g., approximately 2 to 4 oz). Hence, the voltage drop on these power planes is reduced, which advantageously reduces power dissipation and module T-rise.

Any additional three-dimensional features of the frame 102 (e.g., the three-dimensional features of the frame 102 such as those required to align, seat and attach the one or more LGA interposers relative to the frame 102) may be subsequently created through conventional machining processes such as drilling, excising, and mechanical machining operations. Such three-dimensional features include, for example, the post holes 160 and the apertures 202, 204, 206 and 208 of the frame 102 which are discussed below. However, a frame that incorporates power distribution elements in accordance with the preferred embodiments of the invention may be constructed utilizing other technologies, such as insert molding, molded interconnect device (MID) technology and/or laser direct structuring (LDS) technology. Thus, MID and/or LDS technologies, which are discussed below, may be used instead of, or in addition to, conventional PWB laminate technology and/or conventional machining processes for subsequently creating three-dimensional features of the frame.

The bus bars 104, 106 provide conductive paths (e.g., power planes) for the distribution of any type of signal, but preferably for power, power return and/or ground. The bus bars 104, 106 may, for example, distribute power from a first substrate (e.g., the PWB 110) and/or a power cable to a second substrate (e.g., the module substrate 108). The contacts that electrically connect these various elements (e.g., the PWB 110, the module substrate 108 and/or the power cable) to the bus bars 104, 106 are not shown in FIG. 2 for the sake of clarity, but are described in detail below with reference to FIGS. 3-10.

As shown in FIG. 2, in accordance with the preferred embodiments of the invention, the frame 102 includes four apertures 202, 204, 206 and 208 arranged in quadrants, with each of the apertures 202, 204, 206 and 208 being configured to receive an LGA interposer (not shown in FIG. 2). However, those skilled in the art will appreciate that the invention may be implemented with any number and arrangement of apertures. Moreover, one or more of the apertures 202, 204, 206 and 208 may be omitted in favor of a frame structure that has an integral, one-piece construction which incorporates one or more LGA interposers in a contiguous fashion. Hence, a frame structure in accordance with the preferred embodiments of the invention generally includes a land grid array insulator body having a frame portion and one or more interposer portions, wherein the frame portion and the one or more interposer portions may be constructed separately or together as one-piece. When the land grid array insulator body has a one-piece construction that includes the one or more interposer portions, the land grid array insulator body may include segmented power domains within the one or more interposer portions.

Typically, the apertures of a frame serve to align the LGA interposers received therein so that contacts of the interposer properly register with contacts of the PWB at the LGA site and corresponding contacts of the electronics module, and thus such a frame is often referred to as an "alignment frame". Accordingly, the frame 102 may be an alignment frame.

As shown in FIG. 2, in accordance with the preferred embodiments of the invention, the frame 102 incorporates three pair of bus bars 104, 106. Each pair of bus bars 104, 106 includes a bus bar 104 (represented as a solid line in FIG. 2) that is separated by an insulator layer from an underlying bus bar 106 (represented as a dotted line in FIG. 2). A first pair of bus bars 104, 106 is positioned at an upper portion (with respect to FIG. 2) of the frame 102 along the peripheral edge of apertures 202, 208. A second pair of bus bars 104, 106 is positioned at a central portion of the frame 102 between apertures 206, 208 and between 202, 204. The third pair of bus bars 104, 106 is positioned at a lower portion (with respect to FIG. 2) of the frame 102 along the peripheral edge of apertures 204, 206. The number and configuration of the bus bars 104, 106 illustrated in FIG. 2 is, however, exemplary.

Those skilled in the art will appreciate that the invention may be implemented with any number and configuration of bus bars. For example, the bus bars 104, 106 may be coplanar in lieu of, or in addition to, the stacked relationship shown in FIG. 2. The bus bars may also extend perpendicular to one another, extend through the frame 102, and/or extend along a surface of the frame 102. Typically, multi-chip modules (MCMs) have multiple power and voltage domains with a limited number of them carrying relatively high power. In accordance with the preferred embodiments of the invention, the bus bars 104, 106 may be used to increase the performance of the one or two voltage domains that require the greatest current, rather than all of the domains within a multi-chip module. For example, the bus bars 104, 106 may serve separate domains that require the greatest current, or the bus bars 104, 106 may together serve a single domain that requires the greatest current. This would advantageously minimize the number of clearance holes that would be required in the bus bar area and reduce the electrical resistance.

In accordance with the preferred embodiments of the invention, the bus bars, irrespective of their number and configuration, permit power distribution to be enhanced and the voltage drop on the power planes to be reduced, which advantageously reduces power dissipation and module T-rise.

As mentioned above, MID and/or LDS technologies may be used instead of, or in addition to, conventional PWB laminate technology and/or conventional machining processes for subsequently creating three-dimensional features of the frame. MID technology allows for three-dimensional circuit device patterning onto actual molded parts. For example, the three-dimensional features of a frame that are required to align, seat and attach the one or more LGA interposers relative to the frame may be molded into a MID-created frame, which is circuitized via, for example, electroless pattern plating processes. Such three-dimensional features include, for example, the post holes 160 and the apertures 202, 204, 206 and 208 of the frame 102. If the creation of further precision contoured surfaces is required, a laser sensitive injection molded plastic can be used for the frame and these precision contoured surfaces can be created on the molded part prior to plating using a laser machining process known as LDS. At present, MID and/or LDS technologies are typically used to "density" the packaging (i.e., to make the packaging more dense) of small hand held consumer electronic and storage devices, including cell phones, PDAs, and the like. These technologies density the packaging of such devices through the circuitization of the device's molded housing. A frame in accordance with the preferred embodiments of the present invention may be constructed utilizing these technologies as well.

Figure 3:
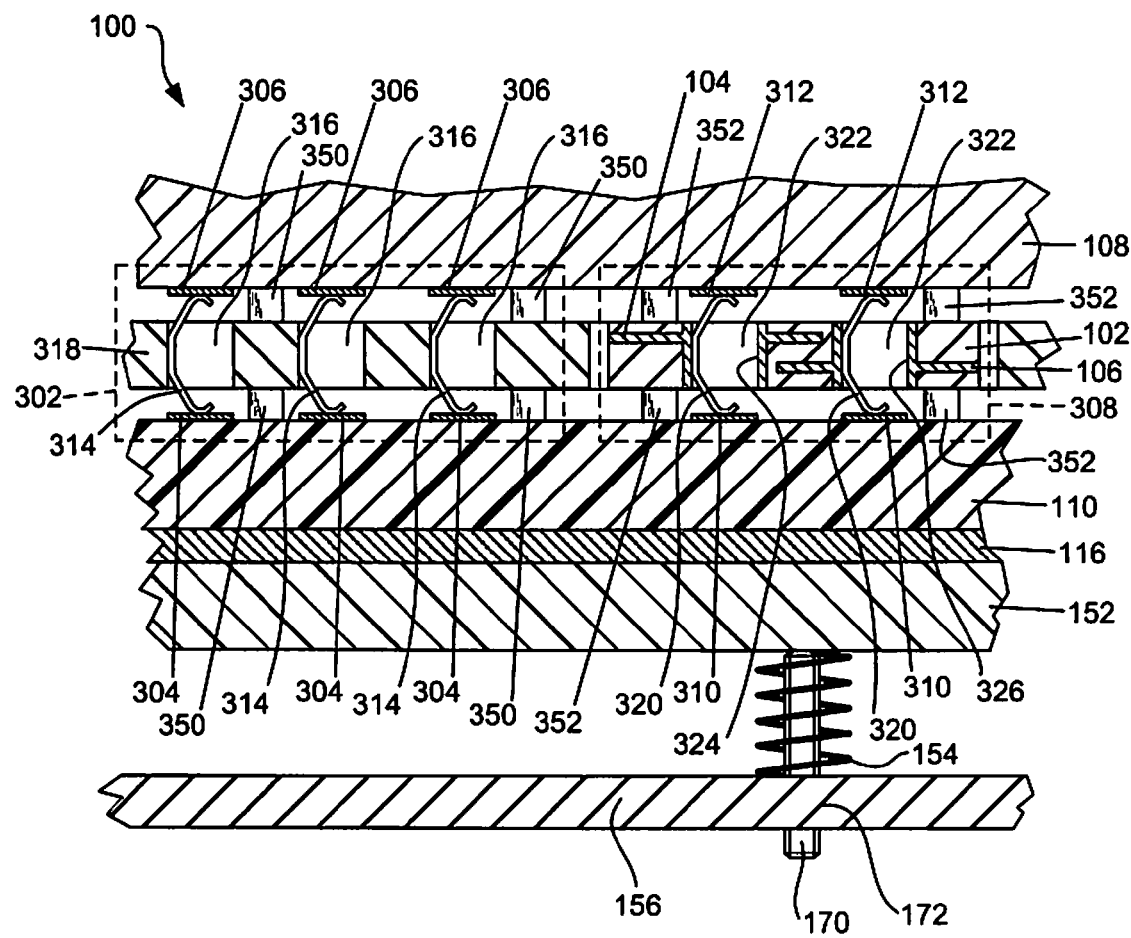
FIG. 3 is a partial, sectional view of the printed wiring board assembly of FIG. 1, taken along the section line indicated in FIG. 1.
Figure 4:
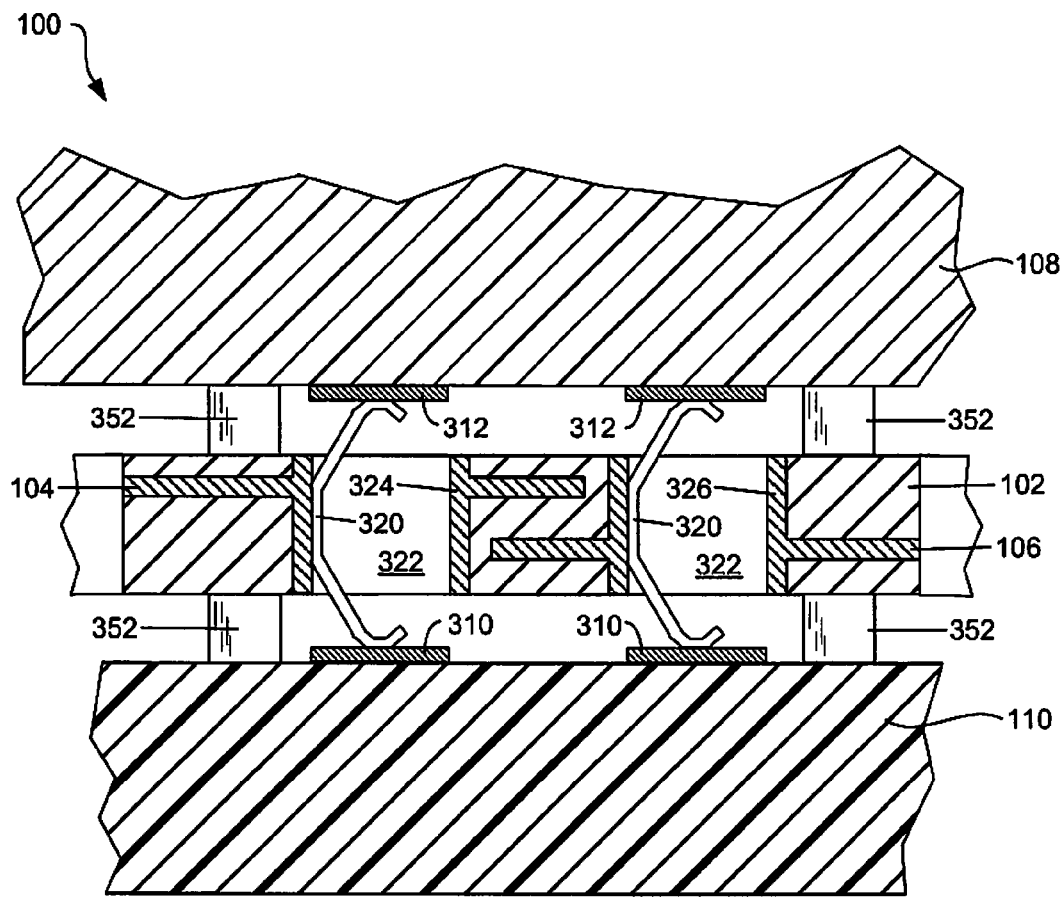
FIG. 4 is an enlarged partial, sectional view of the printed wiring board assembly of FIG. 3, in an area of the frame between two LGA interposers.
Figure 5:
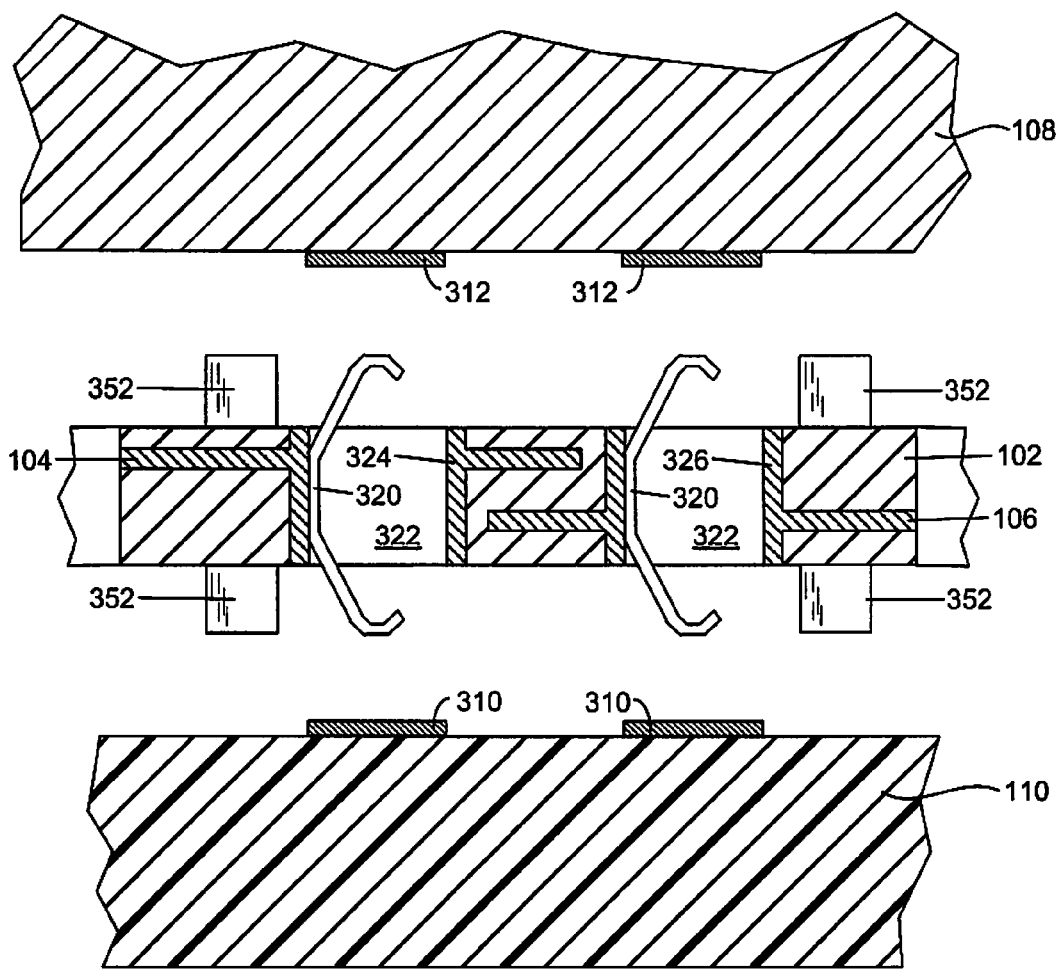
FIG. 5 is an unassembled version of the enlarged partial, sectional view of the printed wiring board assembly shown in FIG. 4.

Reference is now made to FIGS. 3-5. FIG. 3 illustrates, in a partial, sectional view, the printed wire board assembly 100 along the section line 3-3 of FIG. 1. More particularly, FIG. 3 shows a portion of a conventional land grid array (LGA) site 302 comprising contact pads 304 of PWB 110 and corresponding contact pads 306 of module substrate 108, as well as an adjacent portion, outside the conventional LGA site 302, of a frame LGA site 308 comprising additional contact pads 310 on PWB 110 for power, power return and/or ground and corresponding additional contact pads 312 on module substrate 108. These contact pads make electrical contact with each other through spring-type LGA contacts 314 captured in holes 316 of an LGA interposer 318 at the conventional LGA site 302 and through spring-type LGA contacts 320 captured in holes 322 of the frame 102 at the frame LGA site 308 (outside the conventional LGA site 302).

Typically, an LGA interposer, such as the LGA interposer 318, is a molded insulator or thin polymer insulator. A plurality of LGA contacts, such as the spring-type LGA contacts 314, typically are press-fit into holes drilled in the molded or thin polymer insulator. In general, these LGA contacts may be of a press-fit design, surface mount design, and/or friction fit design (e.g., waded wire buttons or molded metal filled elastomer contacts).

With respect to the contacts associated with the LGA interposers (e.g., the spring-type LGA contacts 314 captured in holes 316 of the LGA interposer 318) and with respect to the contacts associated with the frame (e.g., the spring-type LGA contacts 320 captured in the holes 322 of the frame 102), it may be desirable to use contacts with different current ratings. For example, for contacts that are to carry a signal it may be desirable to use contacts with a relatively low current rating, whereas for contacts for power, power return, or ground it may be desirable to use contacts with a relatively high current rating or lower bulk resistance. Hence, at least some of the spring-type LGA contacts 314 used in the LGA interposer 318 may have a different current rating than at least some of the spring-type LGA contacts 320 used in the frame 102. Moreover, it may be desirable for at least some of the spring-type LGA contacts 320 used in the frame 102 to have different current ratings than the rest based on application, current level, etc., and for at least some of the spring-type LGA contacts 314 used in the interposer 318 to have different current ratings than the rest based on application, current level, etc.

Contacts that have a plurality of layers, such as bimetallic contacts, typically have higher current ratings than contacts having a single layer. Thus, for example, it may be desirable for at least some of the spring-type LGA contacts 320 used in the frame 102 to be multi-layer, and for at least some of the spring-type LGA contacts 314 used in the LGA interposer 318 to be single layer. Likewise, it may it may be desirable for some of the spring-type LGA contacts 320 used in the frame 102 to be multi-layer, and for others of the spring-type LGA contacts 320 used in the frame 102 to be single layer.

Generally, single layer contacts use a monolithic alloy (e.g., beryllium copper alloys, Cu—Ni—Si and similar Cu based alloys) overplated with a noble metal (e.g., Au). On the other hand, multi-layer contacts generally consist of metallurgically bonded clad metal sheets; a clad metal inlay (e.g., Ag, Au, Pd or Pt; or alloys of Au, Pd and/or Pt with Ag, Ni or Cu) on a base metal carrier (e.g., stainless steel, highly alloyed Cu—Ni—Si, or other high strength formable alloy); or a highly conductive core (e.g., Ag, Au, Pd or Pt, or alloys of Au, Pd and Pt with Ag, Ni or Cu) clad to structural metal layers (e.g., stainless steel, beryllium copper alloys, highly alloyed Cu—Ni—Si, or other high strength formable alloy). Multi-layered contacts may also be overplated with a noble metal (e.g., Au). Examples of tri-clad contacts include contacts of stainless steel/Ag/beryllium copper and contacts of stainless steel/Ag/stainless steel.

FIG. 4 illustrates, in an enlarged partial, sectional view, the printed wiring board assembly 100 in an area of the frame 102 between two LGA interposers (not shown in FIG. 4).

FIG. 5 is an unassembled version of FIG. 4. That is, FIG. 5 illustrates, in an enlarged partial, sectional view, the printed wiring board assembly 100 in an area of the frame 102 between two LGA interposers (not shown in FIG. 5) in an unassembled state.

Figure 6:
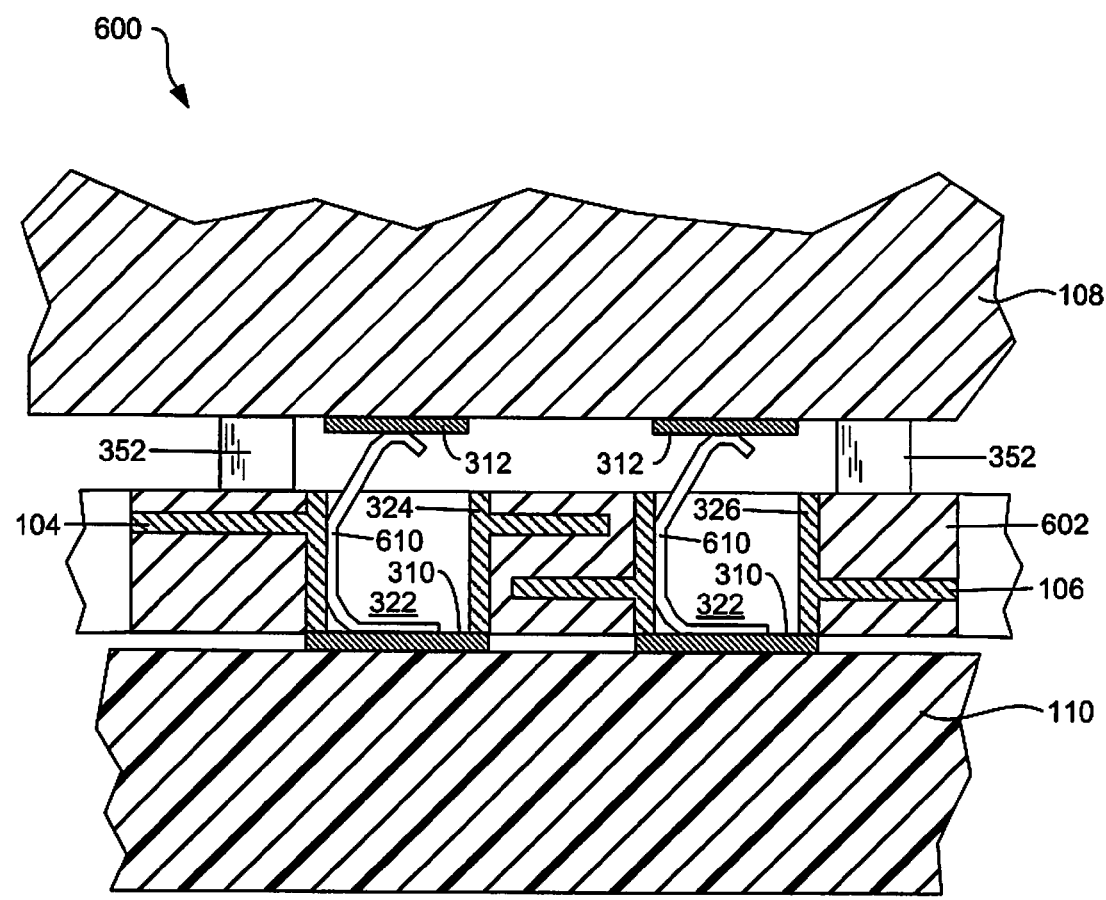
FIG. 6 is an enlarged partial, sectional view of a printed wiring board assembly similar to that shown in FIG. 4, except that the frame incorporates "hybrid" LGA contacts soldered to contact pads of a printed wiring board in lieu of the "true" LGA contacts shown in FIG. 4.
Figure 7:
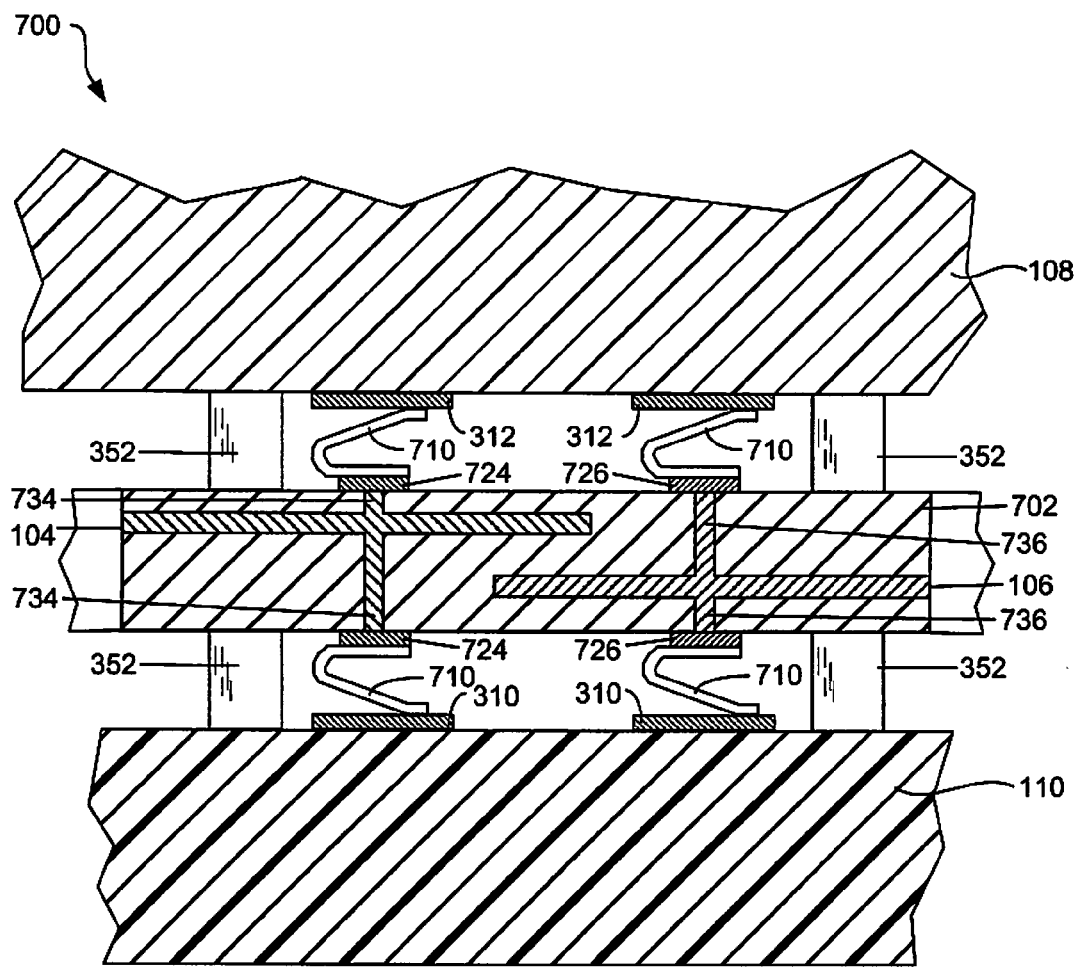
FIG. 7 is an enlarged partial, sectional view of a printed wiring board assembly similar to that shown in FIG. 4, except that the frame incorporates surface-mounted leaf-spring type LGA contacts in lieu of the hole-mounted spring-type LGA contacts shown in FIG. 4.

The spring-type LGA contacts 320 shown in FIGS. 3-5 are exemplary. Those skilled in the art will appreciate that the invention may be implemented with LGA contacts having a different configuration than that shown in FIGS. 3-5. Moreover, those skilled in the art will appreciate that the invention may be implemented with other types of contacts, including hybrid contacts (such as those shown in FIG. 6), leaf-spring type contacts (such as shown in FIG. 7), resilient wire bundle contacts (such as those shown in FIG. 8), molded metal filled elastomer contacts, press-fit pin contacts, surface mounted technology (SMT) contacts, and the like.

In FIGS. 3-5, only two spring-type LGA contacts 320 are shown. Typically, however, the frame 102 includes many similar contacts at selected points along the extent of bus bars 104, 106. One of the two spring-type LGA contacts 320 shown in FIGS. 3-5 is electrically connected to the bus bar 104, while the other of the two spring-type LGA contacts 320 shown in FIGS. 3-5 is electrically connected to the bus bar 106. Each of the spring-type LGA contacts 320 may be, for example, soldered to a plated-through-hole 324, 326 that is electrically connected to a respective one of the bus bars 104, 106 and electrically isolated from the other of the bus bars 104, 106. In general, the LGA contacts associated with the frame may be of a soldered design, press-fit design, surface mount design, and/or friction fit design (e.g., waded wire buttons or molded metal filled elastomer contacts).

Referring now temporarily to FIG. 3, a plurality of stops 350 may be included between the interposer 318 and the module substrate 108 and/or between the interposer 318 and the PWB 110. Similarly, a plurality of stops 352 may be included between the frame 102 and the module substrate 108 and/or between the frame 102 and the PWB 110. However, some or all of the stops 350 and/or some or all of the stops 352 may be omitted. For example, in the case of hybrid contacts (such as those shown in FIG. 6), the stops may be omitted between the interposer and the PWB 110, and between the frame and the PWB 110. Also, in the case of resilient wire bundle contacts (such as those shown in FIG. 8), the stops may be omitted entirely.

The stops 350, if present, preferably project from the interposer 318; whereas, as best seen in FIG. 5, the stops 352, if present, preferably project from the frame 102.

Generally, LGA contacts include "true" LGA contacts where both the PWB and the electronic module are mated with contacts through mechanical/pressure contact, as well as "hybrid" LGA contacts where the contacts are soldered to the PWB and make mechanical/pressure contact with the electronic module. FIG. 6 is an enlarged partial, sectional view of a printed wiring board assembly 600 similar to the printed wiring board assembly 100 shown in FIG. 4, except that the printed wiring board assembly 600 includes a frame 602 that incorporates "hybrid" LGA contacts 610 soldered to contact pads 310 of the PWB 110 in lieu of the "true" LGA contacts 320 shown in FIG. 4. In lieu of the arrangement shown in FIG. 6, the "hybrid" LGA contacts 610 may include ball grid array (BGA)-solderable leads that are soldered to contact pads 310 of the PWB 110. Similar "hybrid" LGA contacts may be incorporated in one or more of the LGA interposers (not shown in FIG. 6) of the printed wiring board assembly 600. As shown in FIG. 6 and mentioned above, no stops are included in this embodiment between the PWB 110 and the frame 102. Likewise, no stops would be included between the PWB 110 and the one or more interposers provided with "hybrid" LGA contacts.

FIG. 7 is an enlarged partial, sectional view of a printed wiring board assembly 700 similar to the printed wiring board assembly 100 shown in FIG. 4, except that the printed wiring board assembly 700 includes a frame 702 that incorporates surface-mounted leaf-spring type LGA contacts 710 in lieu of the hole-mounted spring-type LGA contacts 320 shown in FIG. 4. The leaf-spring LGA contacts 710 are mounted to contact pads formed on the upper and lower (with respect to FIG. 7) surfaces of the frame 702. The two left-most (with respect to FIG. 7) leaf-spring type LGA contacts 710 shown in FIG. 7 may be, for example, soldered to contact pads 724, which are each electrically connected to the bus bar 104 by a conductor-filled via 734. The two right-most (with respect to FIG. 7) leaf-spring type LGA contacts 710 shown in FIG. 7 may be, for example, soldered to contact pads 726, which are each electrically connected to the bus bar 106 by a conductor-filled via 736.

The leaf-spring LGA contacts 710 are forced into electrical contact with contact pads 310, 312, which are respectively provided on the PWB 110 and the module substrate 108. Similar surface-mounted leaf-spring type LGA contacts may be incorporated in one or more of the LGA interposers (not shown in FIG. 7) of the printed wiring board assembly 700.

It may be desirable to selectively omit at least some of leaf-spring type LGA contacts 710 in certain areas along extent of the bus bars 104, 106, such as the two bottom-most (with respect to FIG. 7) leaf-spring type LGA contacts 710 shown in FIG. 7, so that a multi-channel module's power pads (e.g., contact pads 312) are isolated from the system PWB 110 to protect the wiring channel in the center of the multi-channel module.

A plurality of stops 352 may be included between the frame 702 and the module substrate 108, and between the frame 702 and the PWB 110. Preferably, the height of the stops 352 is selected to limit the deflection of the leaf-spring LGA contacts 710 as the leaf-spring LGA contacts are forced into contact with the contact pads 310, 312. Similarly, a plurality of stops may be included between the one or more LGA interposers (not shown in FIG. 7) and the module substrate 108, and between the one or more LGA interposers and the PWB 110. However, some or all of these stops may be omitted.

Figure 8:
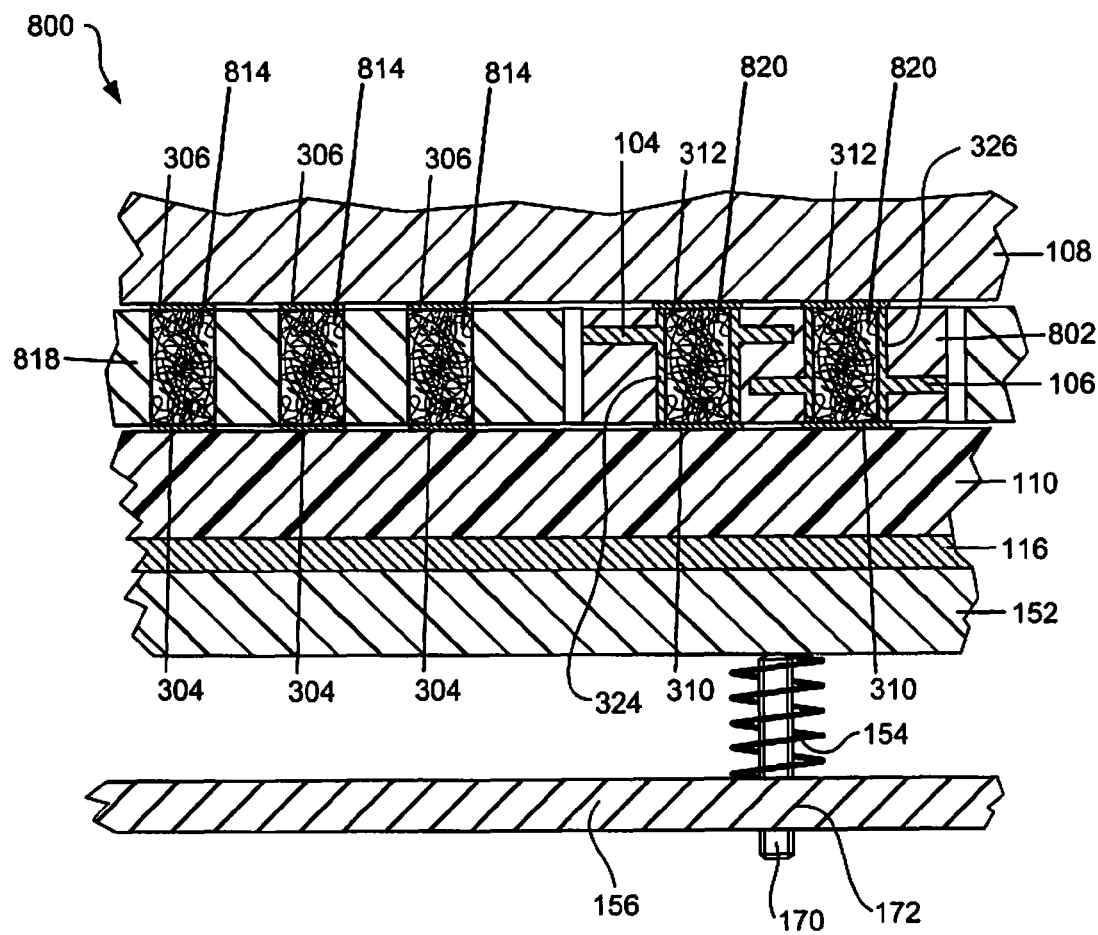
FIG. 8 is a partial, sectional view of a printed wiring board assembly similar to that shown in FIG. 3, except that the frame and the LGA interposers incorporate resilient wire bundle LGA contacts in lieu of the spring-type LGA contacts shown in FIG. 3.

FIG. 8 is a partial, sectional view of a printed wiring board assembly 800 similar to the printed wiring board assembly 100 shown in FIG. 3, except that the frame 802 and the LGA interposer 818 incorporate resilient wire bundle LGA contacts 814 and 820 in lieu of the spring-type LGA contacts 314 and 320 shown in FIG. 3. Similar to the frame 102 shown in FIG. 3, the frame 802 shown in FIG. 8 includes plated-through-holes 324 and 326 that are respectively electrically connected to bus bars 104 and 106. Inserted within each of these plated-through-holes is a resilient wire bundle 820. Such resilient wire bundles are also well known as wadded wire, fuzz buttons, button contacts, button wads, or contact wads, which are collectively referred to herein as resilient wire bundles. As shown in FIG. 8, each resilient wire bundle 820 physically touches and makes electrical contact with its respective plated-through-hole 324, 326. As also shown in FIG. 8, the top end (with respect to FIG. 8) of each resilient wire bundle 820 is forced into electrical contact with the contact pad 312 of the module substrate 108, and the bottom end (with respect to FIG. 8) of each resilient wire bundle 820 is forced into electrical contact with the contact pad 310 of the PWB 110. Alternatively, the frame 802 may be of a hybrid-type, wherein the resilient wire bundles are forced into electrical contact with only one of the substrates, i.e., either the module substrate 108 or the PWB 110.

Resilient wire bundles are also incorporated into the LGA interposer 818, as is conventional and as shown in FIG. 8. More specifically, the top end (with respect to FIG. 8) of each resilient wire bundle 814 is forced into electrical contact with the contact pad 306 of the module substrate 108, and the bottom end (with respect to FIG. 8) of each resilient wire bundle 814 is forced into electrical contact with the contact pad 304 of the PWB 110.

Resilient wire bundles are typically formed from a single strand of metal wire, which is preferably plated with a precious metal such as gold. Resilient wire bundles typically have a wire diameter in the range of approximately 0.002 inch. Preferably, resilient wire bundles 820 are formed from a single strand of gold plated beryllium copper wire having a wire diameter in the range of approximately 0.002 inch. Each strand is preferably wadded together in a random orientation to form a generally cylindrical "button" of wadded wire. Generally, it is preferable that a precious metal wire having a random orientation be used for resilient wire bundle 820 to provide multiple contact points on contact pads 310, 312, increasing the reliability of the overall electrical interconnection by providing multiple hertzian or high localized stress contacts. Suitable resilient wire bundles are exemplified by, but not limited to, resilient wire bundle products sold by Cinch Connectors, Lombard, Ill. under the tradename CIN:: APSE and Tecknit, Inc., Cranford, N.J. under the tradename Fuzz Button.

Figure 9:
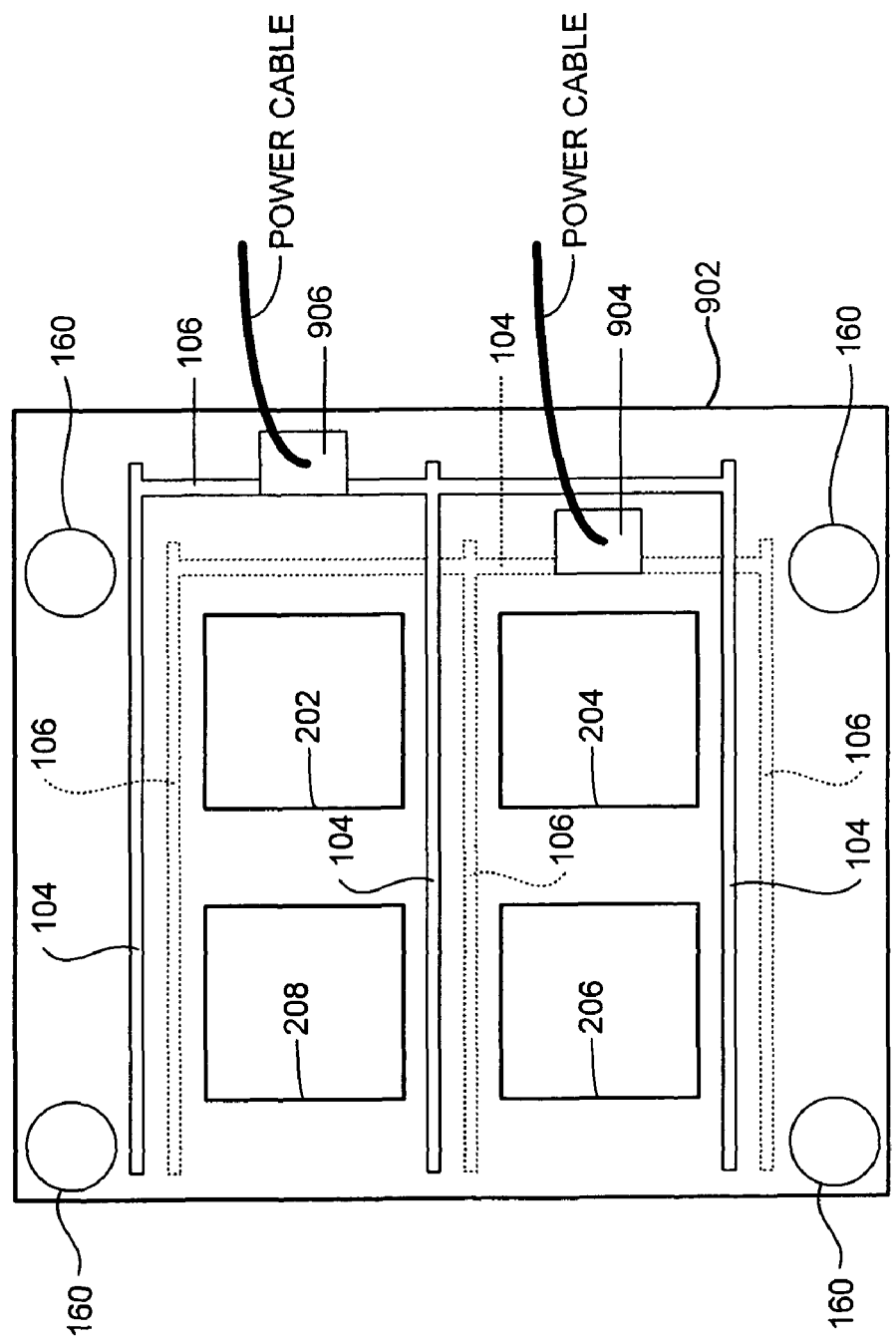
FIG. 9 is a top perspective view of a frame that incorporates power distribution elements and power cable attachment pads according to the preferred embodiments of the present invention. The frame is shown with an upper portion cut away, except at the power cable attach pads, to reveal underlying bus bars.

FIG. 9 is a top perspective view of a frame 902 that incorporates power distribution elements 104 and 106 and power cable attachment pads 904 and 906 according to the preferred embodiments of the present invention. The frame 902 is shown with an upper portion (e.g., a layer of non-conductive material) cut away, except at the power cable attach pads 904, 906, to reveal underlying bus bars 104, 106.

The power cable attachment pad 904 is electrically connected to bus bar 104, while the power cable attachment pad 906 is electrically connected to bus bar 106. One or more conductor-filled vias (not shown in FIG. 9), for example, may electrically connect the power cable attachment pads 904, 906 to their respective bus bars 104, 106. The power cable attachment pads 904, 906 enable power cables to be connected to the bus bars 104, 106 at one or more locations that are remote from the apertures 202, 204, 206, and 208. Thus, the power cable attachment pads 904, 906 can be isolated from the system PWB to protect the wiring channel in the center of the multi-chip module (MCM) site. By using power cables to provide power to the frame, and ultimately to the module substrate, one or more power domains need not be routed through the system PWB. Thus, the provision of an external power input, such as a power cable, to a power distributing frame in accordance with the preferred embodiments of the invention advantageously permits a reduction in power planes in the system PWB.

In the embodiment shown in FIG. 9, the power cable attachment pads 904, 906 would typically receive power as regulated voltage that is delivered by power cables. This contrasts with the embodiment shown in FIG. 10 and described below, in which power is delivered by power cables as one or more relatively "high" voltages (e.g., 350 Volt DC) which is then regulated on the frame before being distributed.

One skilled in the art will appreciate that the power cable attachment pads 904, 906 of the frame 902 may be used to distribute any type of signal, as well as for power, power return, and ground.

Figure 10:
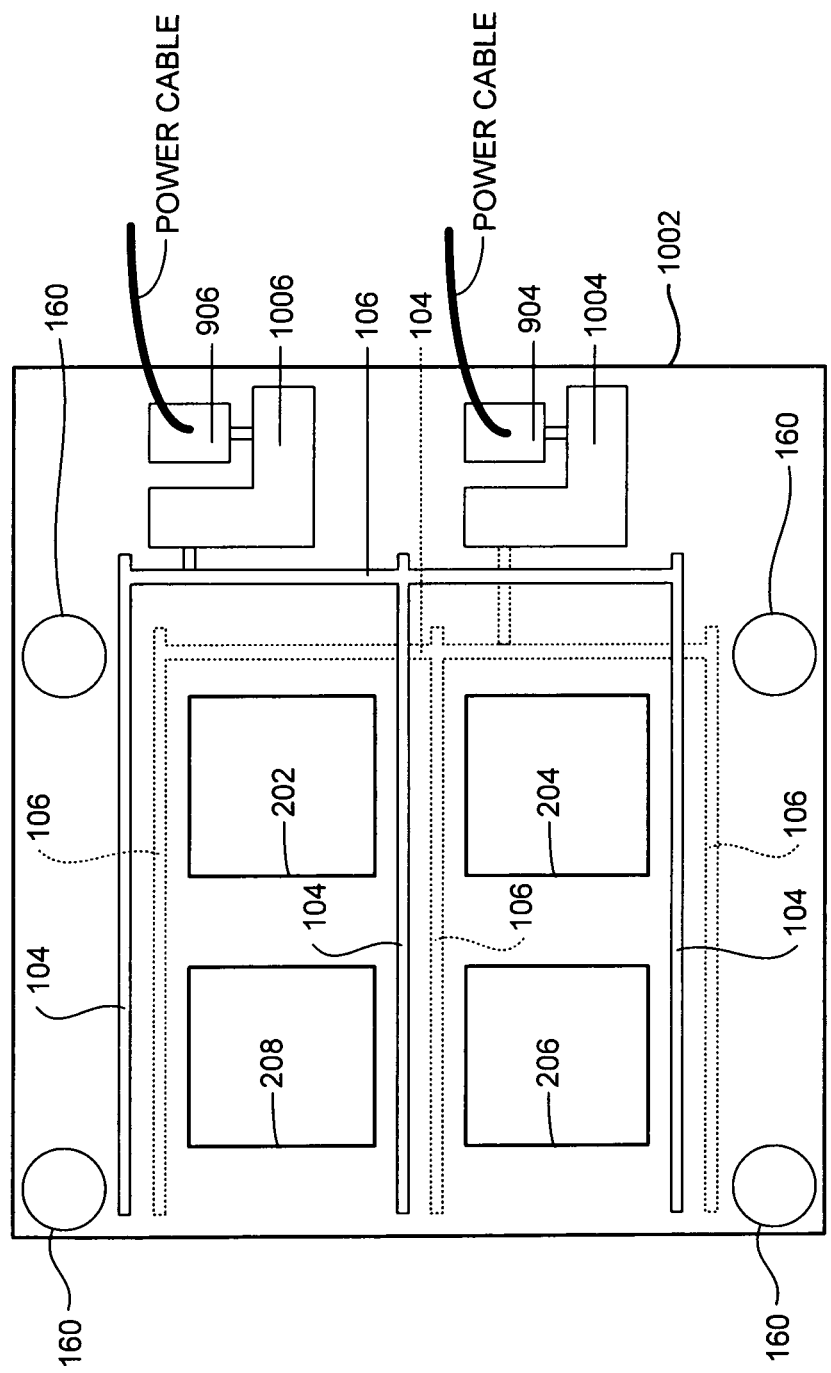
FIG. 10 is a top perspective view of a frame that incorporates power distribution elements, power cable attachment pads, and voltage regulation circuits according to the preferred embodiments of the present invention. The frame is shown with an upper portion cut away, except at the power cable attach pads and voltage regulation circuits, to reveal underlying bus bars.

FIG. 10 is a top perspective view of a frame 1002 that incorporates power distribution elements 104 and 106, power cable attachment pads 904 and 906, and voltage regulation circuits 1004 and 1006 according to the preferred embodiments of the present invention. The frame 1002 is shown with an upper portion (e.g., a layer of non-conductive material) cut away, except at the power cable attachment pads 904, 906 and at the voltage regulation circuits 1004, 1006, to reveal underlying bus bars 104, 106. As mentioned above, the frame 1002 shown in FIG. 10 is similar to the frame 902 shown in FIG. 9 but incorporates voltage regulation circuits 1004, 1006 to regulate one or more relatively "high" voltages (e.g., 350 Volt DC used in some server systems) delivered by power cable to the power cable attachment pads 904, 906 before distribution to the bus bars 104, 106. Accordingly, power may be regulated on the frame 1002 to one or more voltages, each for a specific application. The voltage regulation circuits 1004, 1006 may, for example, include integrated and/or discrete components suitable for voltage regulation.

Figure 11:
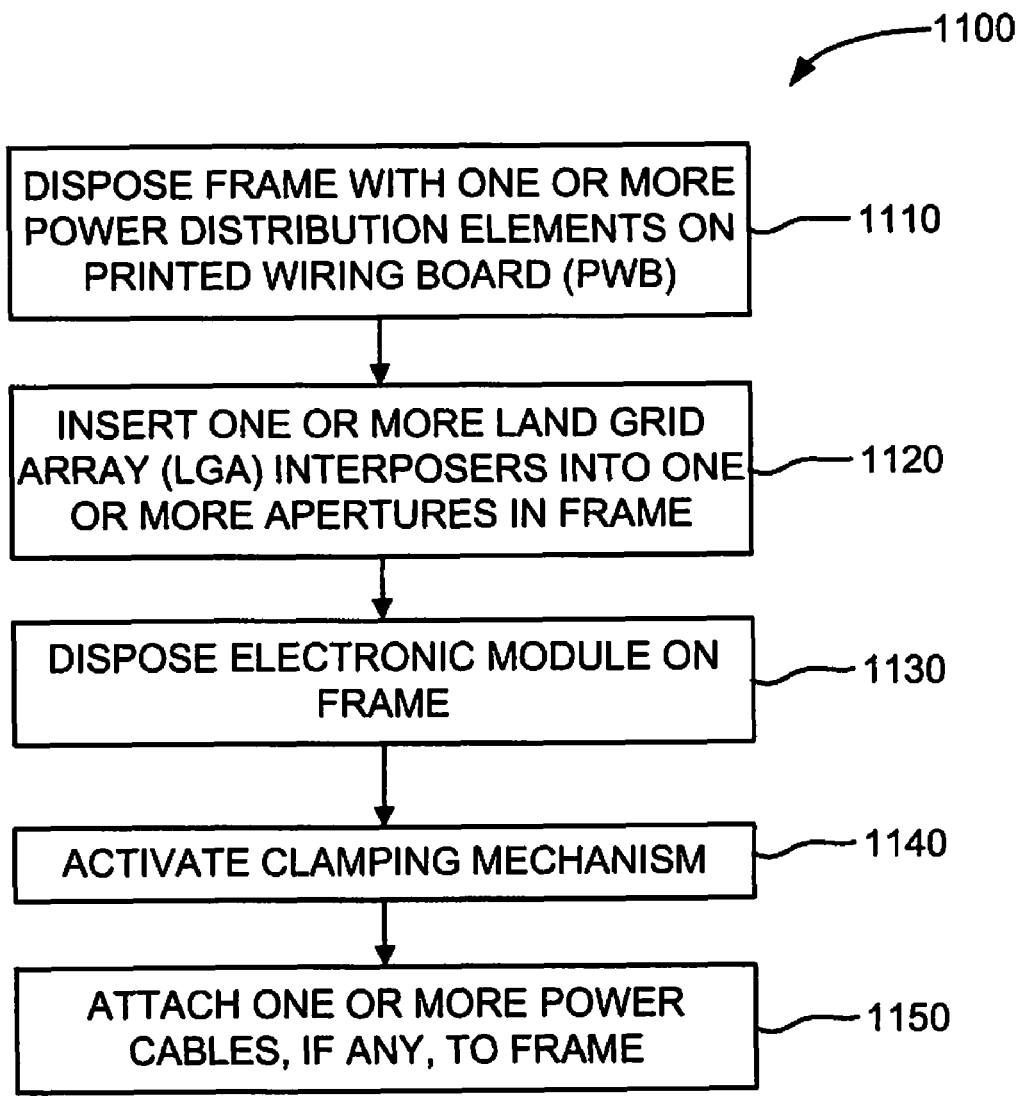
FIG. 11 is a flow diagram of a method for assembling a printed wiring board assembly having an LGA connector provided with a frame that incorporates power distribution elements according to the preferred embodiments of the present invention.

FIG. 11 is a flow diagram of a method 1100 for assembling a printed wiring board assembly having an LGA connector provided with a frame that incorporates power distribution elements according to the preferred embodiments of the invention. Method 1100 sets forth the preferred order of the steps. It must be understood, however, that the various steps may occur at any time relative to one another. The method 1100 begins when a frame that incorporates power distribution elements according to the preferred embodiments of the invention is disposed on a PWB (step 1110). Preferably, at this point, any frame contacts are aligned with corresponding power contact pads on the PWB. For example, with reference to FIGS. 1-3, the frame 102 may be placed on PWB 110 such that cooperation between the posts 158 and the frame post holes 160 aligns the LGA contacts 320 of the frame 102 relative to the power contact pads 310 on the PWB 110.

Next, one or more LGA interposers are inserted into one or more apertures in the frame (step 1120). Preferably, at this point, the LGA contacts of the one or more interposer are aligned with corresponding contact pads on the PWB. For example, with reference to FIGS. 2 and 3, the LGA interposer 318 may be inserted into one of the apertures 202, 204, 206, 208 extending through the frame. Preferably, cooperation between this aperture and the LGA interposer 318 aligns the LGA contacts 314 of the LGA interposer 318 relative to the contact pads 304 of the PWB 110.

An electronic module is then disposed over the frame and the one or more LGA interposers (step 1130). Preferably, at this point, the LGA contacts of the one or more interposer are aligned with corresponding contact pads on the electronic module, and in addition, the frame contacts are aligned with corresponding power contact pads on the electronic module. For example, with reference to FIGS. 1-3, the contact pads 306 on the electronic module's substrate 108 are aligned with the LGA contacts 314 of the interposer 308 and the power contact pads 312 on the module substrate 308 are aligned with the LGA contacts 320 of the frame 102.

The method 1100 continues with the activation of the clamping mechanism (step 1140). For example, with reference to FIGS. 1-3, the actuation screw 170 is rotated clockwise into contact with stiffener 152 to apply an appropriate compressive force that completes and reliably maintains electrical contact between the LGA contacts 314 of the interposer 308 and the contact pads 304, 306, and between the LGA contacts 320 of the frame and the contact pads 310, 312.

If the frame has any power cable attachment pads, the method 1100 includes the connection of one or more power cables to the one or more power cable attachment pads (step 1150). For example, with reference to FIG. 9, a power cable may be attached to each of the power cable attachment pads 906, 908 of the frame 902.

One skilled in the art will appreciate that many variations are possible within the scope of the present invention. For example, although the preferred embodiments of the present invention are described herein within the context of a land grid array (LGA) connector that connects an electronic module to a PCB, the present invention may be utilized in connecting any two substrates, such as connecting a ribbon substrate to any of a PCB, an electronic module, or another ribbon substrate. Moreover, different types and configurations of clamping mechanisms known in the art may be used to force the substrates together in lieu of the post/spring-plate type clamping mechanism described herein. Thus, while the present invention has been particularly shown and described with reference to the preferred embodiments thereof, it will be understood by those skilled in the art that these and other changes in form and detail may be made therein without departing from the spirit and scope of the present invention.

What is claimed is:

1. A frame structure for a land grid array connector for electrically connecting two substrates, comprising:
    a land grid array insulator body having a frame portion and one or more interposer portions, the land grid array insulator body having a first surface and a second surface, the frame portion of the land grid array insulator body including one or more layers of electrically conductive material sandwiched between layers of electrically non-conductive material;
    a plurality of contacts extending at least partially through each interposer portion of the land grid array insulator body from proximate the first surface of the land grid array insulator body to proximate the second surface of the land grid array insulator body for electrically connecting a plurality of contacts of a first substrate to a plurality of contacts of a second substrate;
    one or more contacts proximate the first surface of the frame portion of the land grid array insulator body being configured to make electrical contact with at least one of a power cable and/or one or more contacts of the first substrate, the one or more contacts proximate the first surface of the frame portion of the land grid array insulator body being in electrical contact with at least one of the one or more layers of electrically conductive material, and
    further comprising: one or more contacts proximate the second surface of the frame portion of the land grid array insulator body being configured to make electrical contact with one or more contacts of the second substrate, the one or more contacts proximate the second surface of the frame portion of the land grid array insulator body being in electrical contact with at least one of the one or more layers of electrically conductive material.

2. The frame structure as recited in claim 1, wherein the first substrate is an electronic module and the second substrate is a printed wiring board, the frame structure further comprising:
    one or more plated-through-holes in the frame portion of the land grid array insulator body extending from the first surface of the frame portion of the land grid array insulator body to the second surface of the frame portion of the land grid array insulator body;
    one or more LGA contacts respectively disposed in the one or more plated-through-holes, each LGA contact being configured to electrically connect a power pad on the electronic module to a power pad on the printed wiring board.

3. The frame structure as recited in claim 1, wherein at least one of the one or more layers of electrically conductive material is a power plane, wherein the first substrate is an electronic module and the second substrate is a printed wiring board, wherein at least one of the one or more contacts proximate the first surface of the frame portion of the land grid array insulator body is a leaf spring contact, is in electrical contact with the power plane, and is configured to make electrical contact with a power pad on the electronic module, and wherein at least one of the one or more contacts proximate the second surface of the frame portion of the land grid array insulator body is in electrical contact with the power plane and is configured to make electrical contact with a power pad on the printed wiring board.

4. The frame structure as recited in claim 1, wherein the at least one contact proximate the first surface of the frame portion of the land grid array insulator body and the at least one contact proximate the second surface of the frame portion of the land grid array insulator body are configured to be engaged with their respective power pads through mechanical/pressure contact.

5. The frame structure as recited in claim 1, wherein the at least one contact proximate the first surface of the frame portion of the land grid array insulator body is configured to be engaged with the power pad on the electronic module through mechanical/pressure contact, and wherein the at least one proximate the second surface of the frame portion of the land grid array insulator body is configured to be soldered to a power pad on the printed wiring board.

6. The frame structure as recited in claim 1, wherein at least one of the one or more layers of electrically conductive material is a power plane, wherein the first substrate is an electronic module and the second substrate is a printed wiring board, wherein a first of the one or more contacts proximate the first surface of the frame portion of the land grid array insulator body is in electrical contact with the power plane and is configured to make electrical contact with a power pad on the electronic module, and wherein a second of the one or more contacts proximate the first surface of the frame portion of the land grid array insulator body is in electrical contact with the power plane and is configured to make electrical contact with a power cable.

7. The frame structure as recited in claim 1, wherein at least one of the one or more layers of electrically conductive material is a power plane, wherein the first substrate is an electronic module and the second substrate is a printed wiring board, wherein a first of the one or more contacts proximate the first surface of the frame portion of the land grid array insulator body is in electrical contact with the power plane and is configured to make electrical contact with a power pad on the electronic module, and wherein a second of the one or more contacts proximate the first surface of the frame portion of the land grid array insulator body is configured to make electrical contact with a power cable, the frame structure further comprising:
voltage regulation circuitry electrically connected to the power plane and the second contact proximate the first surface of the frame portion of the land grid array insulator body for producing a regulated module supply voltage for the electronic module using the voltage received from the power cable.

8. The frame structure as recited in claim 1, wherein the land grid array insulator body includes four of the interposer portions arranged in quadrants, and wherein the one or more layers of electrically conductive material extend(s) in the frame portion of the land grid array insulator body between at least two of the quadrants and/or adjacent a peripheral edge of one or more of the quadrants.

9. The frame structure as recited in claim 1, wherein the land grid array insulator body includes four of the interposer portions arranged in quadrants, and wherein one of the layers of electrically conductive material is configured as at least two bus bars each defining a power domain and each extending in the frame portion of the land grid array insulator body between two of the quadrants and/or adjacent a peripheral edge of one or more of the quadrants.

10. The frame structure as recited in claim 1, wherein the land grid array insulator body includes four of the interposer portions arranged in quadrants, and wherein a plurality of the layers of electrically conductive material are configured as a plurality of bus bars stacked one above the other, wherein each bus bar defines a power domain and each bus bar extends in the frame portion of the land grid array insulator body between two of the quadrants and/or adjacent a peripheral edge of one or more of the quadrants.

11. The frame structure as recited in claim 1, wherein the frame portion and the one or more interposer portions of the land grid array insulator body are contiguous, and wherein the land grid array insulator body has an integral, one-piece construction.

12. The frame structure as recited in claim 1, wherein at least one of the one or more contacts proximate the first surface of the frame portion of the land grid array insulator body is a multi-layer contact.

13. The frame structure as recited in claim 1, wherein at least one of the one or more contacts proximate the first surface of the frame portion of the land grid array insulator body has a current rating that is higher than that of at least some of the plurality of contacts extending at least partially through each interposer.

14. The frame structure as recited in claim 1, wherein at least one of the one or more contacts proximate the first surface of the frame portion of the land grid array insulator body has a current rating that is higher than that of another of the one or more contacts proximate the first surface of the frame portion of the land grid array insulator body.

15. A frame structure for a land grid array connector for electrically connecting two substrates, comprising:
a land grid array insulator body having a frame portion and one or more interposer portions, the land grid array insulator body having a first surface and a second surface, the frame portion of the land grid array insulator body including one or more layers of electrically conductive material sandwiched between layers of electrically non-conductive material;
a plurality of contacts extending at least partially through each interposer portion of the land grid array insulator body from proximate the first surface of the land grid array insulator body to proximate the second surface of the land grid array insulator body for electrically connecting a plurality of contacts of a first substrate to a plurality of contacts of a second substrate;
one or more contacts proximate the first surface of the frame portion of the land grid array insulator body being configured to make electrical contact with at least one of a power cable and/or one or more contacts of the first substrate, the one or more contacts proximate the first surface of the frame portion of the land grid array insulator body being in electrical contact with at least one of the one or more layers of electrically conductive material, wherein the land grid array insulator body has a multi-piece construction, wherein the one or more interposer portions of the land grid array insulator body comprise one or more land grid array interposers, and wherein the frame portion of the land grid array insulator body comprises a frame that includes one or more apertures extending from a top surface of the frame to a bottom surface of the frame, each aperture being configured to receive one of the one or more land grid array interposers.

16. A frame structure for a land grid array connector for electrically connecting an electronic module and a printed wiring board, comprising:
a frame having a first surface and a second surface, the frame including one or more layers of electrically conductive material sandwiched between layers of electrically non-conductive material;
one or more apertures in the frame extending from the first surface of the frame to the second surface of the frame, each aperture being configured to receive a land grid array interposer having a plurality of contacts for electrically connecting a plurality of contacts of the electronic module to a plurality of contacts of the printed wiring board; one or more contacts proximate the first surface of the frame being configured to make electrical contact with one or more contacts of the electronic module, the one or more contacts proximate the first surface of the frame being in electrical contact with at least one of the one or more layers of electrically conductive material, and
further comprising: one or more contacts proximate the second surface of the frame being configured to make electrical contact with one or more contacts of the printed wiring board, the one or more contacts proximate the second surface of the frame being in electrical contact with at least one of the one or more layers of electrically conductive material.

17. A frame structure for a land grid array connector for electrically connecting an electronic module and a printed wiring board, comprising:
- a frame having a first surface and a second surface, the frame including one or more layers of electrically conductive material sandwiched between layers of electrically non-conductive material;
- one or more apertures in the frame extending from the first surface of the frame to the second surface of the frame, each aperture being configured to receive a land grid array interposer having a plurality of contacts for electrically connecting a plurality of contacts of the electronic module to a plurality of contacts of the printed wiring board;
- one or more contacts proximate the first surface of the frame being configured to make electrical contact with one or more contacts of the electronic module, the one or more contacts proximate the first surface of the frame being in electrical contact with at least one of the one or more layers of electrically conductive material;
- one or more power cable attachment contacts proximate the first surface of the frame being configured to make electrical contact with a power cable at a position relatively remote from the one or more apertures, the one or more power cable attachment contacts proximate the first surface of the frame being in electrical contact with at least one of the one or more layers of electrically conductive material.

* * * * *